(12) United States Patent
Shibazaki

(10) Patent No.: US 8,717,543 B2
(45) Date of Patent: May 6, 2014

(54) SUBSTRATE HOLDER, STAGE APPARATUS, AND EXPOSURE APPARATUS WITH FIRST SUPPORT PART PROVIDED IN A SUCTION SPACE AND SECOND SUPPORT PART

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 300 days.

(21) Appl. No.: 12/656,058

(22) Filed: Jan. 14, 2010

(65) Prior Publication Data

US 2010/0141924 A1      Jun. 10, 2010

Related U.S. Application Data

(63) Continuation of application No. 11/661,372, filed as application No. PCT/JP2005/015687 on Aug. 29, 2005, now abandoned.

(30) Foreign Application Priority Data

Sep. 1, 2004   (JP) ................................. 2004-253978

(51) Int. Cl.
    *G03B 27/60*   (2006.01)
(52) U.S. Cl.
    USPC .......................................................... 355/73
(58) Field of Classification Search
    USPC .................................... 355/73, 72, 74–76, 53
    See application file for complete search history.

(56) References Cited

U.S. PATENT DOCUMENTS

| | | | |
|---|---|---|---|
| 5,528,118 A | 6/1996 | Lee | |
| 5,623,853 A | 4/1997 | Novak et al. | |
| 5,793,474 A | 8/1998 | Nishi | |
| 5,874,820 A | 2/1999 | Lee | |
| 5,923,408 A | 7/1999 | Takabayashi | |
| 5,969,441 A | 10/1999 | Loopstra et al. | |
| 6,255,796 B1 | 7/2001 | Ebihara et al. | |
| 6,266,133 B1 | 7/2001 | Miyajima et al. | |
| 6,426,790 B1 | 7/2002 | Hayashi | |
| 6,767,170 B2 | 7/2004 | Kostler et al. | |
| 2004/0160582 A1* | 8/2004 | Lof et al. | ........................ 355/30 |

FOREIGN PATENT DOCUMENTS

| | | |
|---|---|---|
| EP | 1 132 948 A2 | 9/2001 |
| JP | A 63-141313 | 6/1988 |
| JP | A 4-152512 | 5/1992 |
| JP | A 4-280619 | 10/1992 |
| JP | A-08-063231 | 3/1996 |
| JP | A-08-102437 | 4/1996 |

(Continued)

OTHER PUBLICATIONS

Mar. 29, 2011 Notice of Reasons for Rejection for related Application No. 2006-532686 w/English translation.

(Continued)

*Primary Examiner* — Toan Ton
*Assistant Examiner* — Chia-how Michael Liu
(74) *Attorney, Agent, or Firm* — Oliff PLC

(57) ABSTRACT

An object of the invention is to hold a substrate with satisfactory flatness, even at a circumferential edge part that surrounds a suction space. The invention is equipped with a circumferential edge part that surrounds a suction space, and a first support part that is provided in the suction space and that supports a substrate. Furthermore, the invention is equipped with a second support part that extends from the circumferential edge part to the first support part and that supports the substrate.

21 Claims, 9 Drawing Sheets

(56) References Cited

FOREIGN PATENT DOCUMENTS

| | | |
|---|---|---|
| JP | A-08-166475 | 6/1996 |
| JP | A-08-330224 | 12/1996 |
| JP | A-10-163099 | 6/1998 |
| JP | A 10-233433 | 9/1998 |
| JP | A-10-214783 | 11/1998 |
| JP | A-11-317440 | 11/1999 |
| JP | A-2000-505958 | 5/2000 |
| JP | A-2001-058866 | 3/2001 |
| JP | B2-3205468 | 6/2001 |
| JP | A 2001-244177 | 9/2001 |
| JP | A 2002-246450 | 8/2002 |
| JP | A 2006-054364 | 2/2006 |
| WO | WO 99/49504 | 9/1999 |

OTHER PUBLICATIONS

Feb. 11, 2009 Office Action issued in U.S. Appl. No. 11/661,372.
Jul. 14, 2009 Office Action issued in U.S. Appl. No. 11/661,372.
May 15, 2009 European Search Report issued in counterpart EP Application No. 05774525.9.
Jun. 26, 2008 Written Opinion issued in counterpart Singapore Patent Appln. No. 200701514-2.
Feb. 25, 2009 Notice of Allowance issued in counterpart Singapore Patent Appln. No. 200701514-2.
Dec. 20, 2005 International Search Report issued in counterpart PCT Patent Appln. No. PCT/JP2005/015687, w/English translation.
Dec. 20, 2005 Written Opinion issued in counterpart PCT Patent Appln. No. PCT/JP2005/015687, w/English translation.
Feb. 2, 2010 Office Action issued in counterpart JP Patent Appln. No. 2006-532686, w/English translation.
Dec. 14, 2010 Office Action issued in counterpart JP Patent Appln. No. 2006-532686, w/English translation.
Taiwanese Patent Office, Preliminary Notice of First Office Action mailed Jul. 27, 2012 in Taiwanese Patent Application No. 094129623 w/English-language Translation.

* cited by examiner

SUBSTRATE HOLDER, STAGE APPARATUS, AND EXPOSURE APPARATUS WITH FIRST SUPPORT PART PROVIDED IN A SUCTION SPACE AND SECOND SUPPORT PART

This is a Continuation of Application Ser. No. 11/611,372 filed Feb. 28, 2007, which is a National Phase of PCT/JP2005/015687 filed Aug. 29, 2005. The disclosure of the prior applications are hereby incorporated by reference herein in their entirety.

BACKGROUND

The present invention relates to a substrate holder, a stage apparatus, and an exposure apparatus, and more particularly relates to, for example, a substrate holder and a stage apparatus that are ideal for vacuum chucking a substrate, such as a wafer, as well as an exposure apparatus that comprises this substrate holder.

The disclosure of the following priority application is hereby incorporated by reference in its entirety: Japanese Patent Application No. 2004-253978, which was filed on Sep. 1, 2004.

Projection type exposure apparatuses and laser repair apparatuses are known examples of apparatuses that fabricate, for example, semiconductor wafers (hereinbelow, called wafers) used in the manufacture of semiconductor devices as well as substrates, such as glass substrates.

In the case of a projection type exposure apparatus, a projection lens (projection optical system) is provided for imaging and projecting a circuit pattern of a reticle onto a substrate front surface at a prescribed magnification. This projection lens needs to have high resolving power, particularly in the case of a reduction projection lens, while simultaneously securing a large projection area, and, consequently, the NA (numerical aperture) has increased year by year while the depth of focus has attendantly decreased.

Consequently, with an exposure apparatus as described above, the substrate must be precisely planar in order to prevent resolution defects that are caused by the mispositioning of the substrate front surface with respect to the focal point position, and thereby to form a fine circuit pattern; therefore, a substrate holder is used that vacuum chucks the abovementioned substrate and performs a correction to flatten the substrate within a prescribed plane.

Patent Document 1 cites an example of a prior art substrate holder wherein support pins are provided that support a wafer inside a suction chamber that is surrounded by part covers the outer circumferential wall of a wafer chuck (substrate holder), which vacuum chucks the wafer by negatively pressurizing the suction chamber in a state wherein the wafer is chucked and flat with respect to the upper surfaces of the support pins and the outer circumferential wall. In addition, with this type of substrate holder, the suction force applied by the suction apparatus to negatively pressurize the suction chamber acts upon the inner flat surface of the wafer, but not upon its outer circumferential part, which causes such to warp even when using a wafer that has satisfactory flatness.

Accordingly, Patent Document 1 discloses a technology that employs the Venturi effect to cause a force to act in a direction that prevents warpage of the wafer's outer circumferential part by providing a suction groove, which externally draws a gas into the suction chamber, to the outer circumferential wall.

Nevertheless, the related art discussed above has the following types of problems.

When forming the suction groove in the outer circumferential wall, there is a problem in that it is necessary to strictly control the size of the suction groove in order to control the force that prevents warpage, which makes alignment troublesome.

In addition, there is also a concern that when liquid is filled between the wafer and the projection optical system and a pattern is exposed on the wafer through this liquid, i.e., when so-called immersion exposure is performed, the liquid will infiltrate the suction chamber from the suction groove.

In addition, to reduce the effect of dust located between the wafer and the support pins, the size of the upper surfaces of the support pins have shrunk in recent years, thereby creating a tendency for the support pin tips to bite into the rear surface of the wafer, which in turn tends to increase warpage (waviness) of the wafer between the location of the wafer that is supported by the outer circumferential wall and the location that is supported by the support pins.

Waviness of an exposure slit (a slit through which exposure illumination light is projected), which is for transferring the pattern to the wafer, is compensated for by correcting the position of the wafer front surface by driving (e.g., leveling) a wafer stage so that the flatness of the slit is within a prescribed value; however, compensating for waviness using the stage drive is problematic because, for example, waviness increases if the exposure slit is at a position where it straddles the outer circumferential wall.

A purpose of some aspects of the invention is to provide a substrate holder that can hold a substrate so that its flatness is stable and satisfactory even at a circumferential edge part that surrounds a suction space, as well as a stage apparatus and an exposure apparatus.

SUMMARY OF THE INVENTION

A substrate holder of the present invention is a substrate holder (PH) that comprises: a circumferential edge part that surrounds a suction space; and a first support part that is provided in the suction space and that supports a substrate; comprising a second support part that extends from the circumferential edge part to the first support part and that supports the substrate.

Accordingly, with the substrate holder of the present invention, the second support part is linear (a projection) from the circumferential edge part to the first support part and supports the substrate at the circumferential edge part, which makes it possible to suppress waviness and warpage that occurs between the circumferential edge part (33) and the first support part.

In addition, the stage apparatus of the present invention is a stage apparatus that holds and moves a substrate, comprising: the abovementioned substrate holder, which serves as a substrate holder that holds the substrate.

Accordingly, with the stage apparatus of the present invention, it is possible to hold the substrate and move it to a prescribed position without causing major waviness or warpage of the substrate at the circumferential edge part of the substrate holder.

Furthermore, an exposure apparatus of the present invention is an exposure apparatus that uses a stage apparatus to expose a substrate with a pattern, wherein the abovementioned stage apparatus is used as the stage apparatus.

Accordingly, with the exposure apparatus of the present invention, the substrate can be moved without causing major waviness or warpage of the substrate at the circumferential edge part of the substrate holder, which makes it possible to transfer the pattern to the substrate with a prescribed transfer accuracy.

Furthermore, to facilitate understanding, the present invention was explained by referencing corresponding symbols in the drawings, which show one embodiment, but the present invention is of course not limited thereto.

The present invention can support a substrate with a stable and satisfactory flatness, and can therefore form a high resolution pattern thereon.

In addition, when performing an exposure by using a liquid, the present invention prevents the infiltration of the liquid between the substrate and the substrate holder, which makes it possible to stably perform the exposure process.

The following explains embodiments of a substrate holder, a stage apparatus, and an exposure apparatus of the present invention, referencing FIG. 1 through FIG. 9.

DETAILED DESCRIPTION OF EMBODIMENTS

Figure 1:
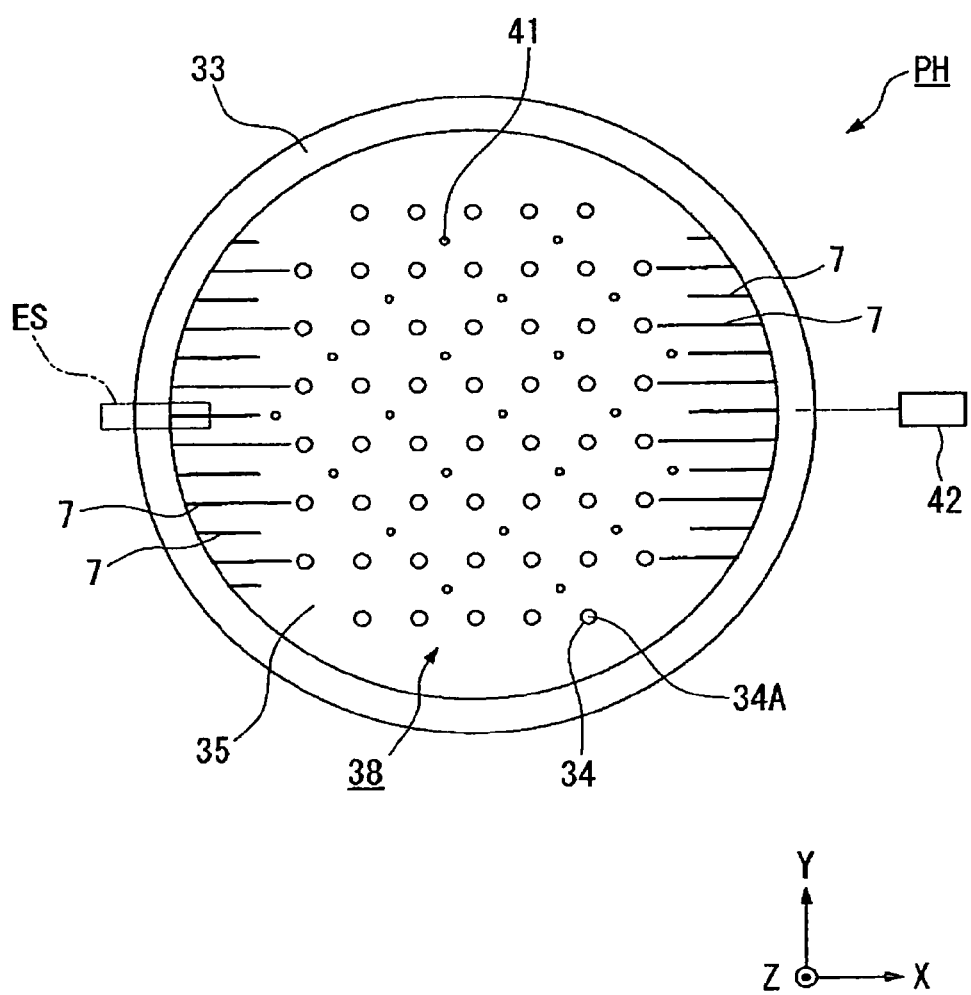
FIG. 1 is a plan view of a substrate holder according to one embodiment of the present invention.
Figure 2:
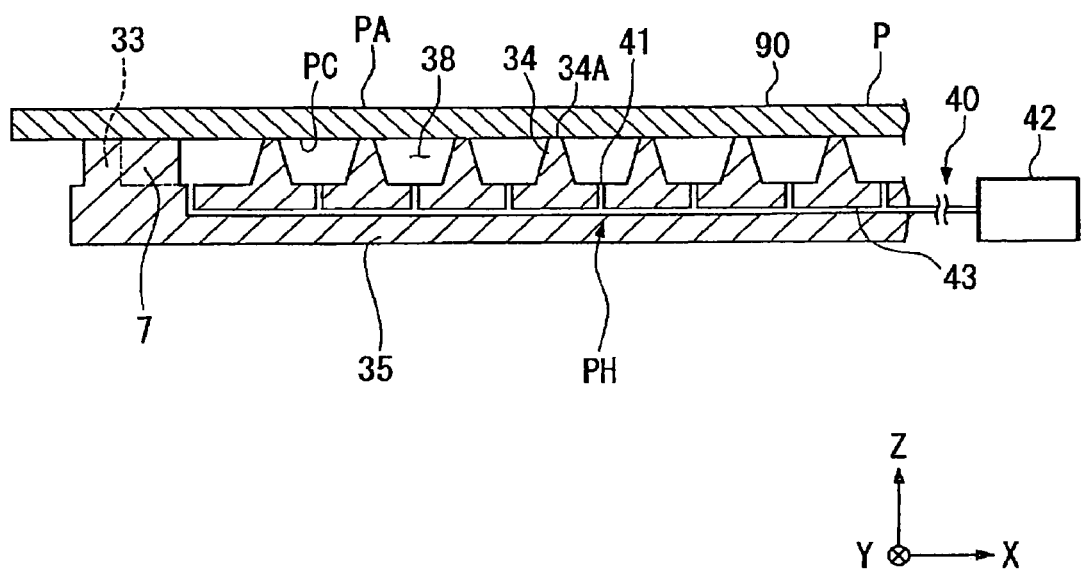
FIG. 2 is a partially enlarged view of the substrate holder holding a substrate.

First, a first embodiment of the substrate holder according to the present invention will be explained, referencing FIG. 1 and FIG. 2. FIG. 1 is a plan view of the substrate holder and FIG. 2 is a partially enlarged view that shows the substrate holder holding a substrate P.

A substrate holder PH vacuum chucks the substrate P and comprises: a substantially discoidal base part 35; a circumferential wall part 33 (circumferential edge part), which is provided along a circumferential edge of the base part 35 so that it is upright, that supports a rear surface PC of the substrate P on the inner side of the outer circumference of the substrate P; a plurality of support parts 34 (first support parts) that are evenly disposed in a suction space 38, which is on the inner side of and surrounded by the circumferential wall part 33, and that supports the substrate P; and a plurality of rib shaped support parts 7 (second support parts), which extend from the circumferential wall part 33 toward the support parts 34, that linearly supports the substrate P. Furthermore, in the present embodiment as shown in FIG. 2, the height of each of the support parts 34 is the same as the height of each of the rib shaped support parts 7. Furthermore, the height of each of the support parts 34 and of each of the rib shaped support parts 7 is the same as the height of the circumferential wall part 33.

The support parts 34 constitute a pin chuck (refer to FIG. 2) and are trapezoidal in a cross sectional view; furthermore, each of the support parts 34 has an upper end surface 34A, the diameter of which is minute, that holds the rear surface PC of the substrate P.

The rib shaped support parts 7 are each formed so that they extend along the X axial direction and are disposed on both sides of the substrate holder PH in the X axial directions and are spaced apart at intervals in the Y axial directions. In addition, the rib shaped support parts 7 are formed so that one end of each is connected to the circumferential wall part 33; furthermore, the lengths of the rib shaped support parts 7 extending from the circumferential wall part 33 to the support part 34 vary so that the tips of their other ends form a zigzag shape and do not line up linearly or arcuately. Furthermore, the support surface area of each of the rib shaped support parts 7 that supports the substrate P is set larger than the support surface area of each of the support parts 34 that supports the substrate P (to facilitate understanding, FIG. 2 shows the surface area of each of the upper end surfaces 34A of the support parts 34 larger than it actually is).

Furthermore, the substrate holder PH is manufactured by, for example, sandblasting or etching a ceramic material to remove portions that do not include the circumferential wall part 33, the support parts 34, and the rib shaped support parts 7. In other words, the substrate holder PH is constituted so that the circumferential wall part 33, the support parts 34, and the rib shaped support parts 7 are integrally formed on the base part 35 from a ceramic material.

In addition, the substrate holder PH comprises a suction apparatus 40 that negatively pressurizes the suction space 38, which is surrounded by the circumferential wall part 33. The suction apparatus 40 comprises: a plurality of suction ports 41, which are provided to an upper surface of the base part 35 of the substrate holder PH; a vacuum part 42, which includes an externally provided vacuum pump; and a passageway 43, which is formed inside the base part 35 and connects the vacuum part 42 to each of the suction ports 41. The suction ports 41 are provided at prescribed locations on the upper surface of the base part 35 that are different from the locations of the support parts 34. The suction apparatus 40 is constituted so that it negatively pressurizes the suction space 38 by suctioning the gas (air) inside the suction space 38, which is formed so that it is surrounded by the circumferential wall part 33, the base part 35, the support parts 34, and the substrate P supported on the rib shaped support parts 7.

With the substrate holder PH constituted as described above, after the substrate P is mounted on the circumferential wall part 33, the support parts 34, and the rib shaped support parts 7, the suction space 38 is negatively pressurized by the operation of the vacuum part 42 of the suction apparatus 40, and the rear surface PC of the substrate P is thereby vacuum chucked to the circumferential wall part 33, the support parts 34, and the rib shaped support parts 7.

At this time, the negative pressure suction force from the suction apparatus 40 acts upon an inner flat surface of the substrate P, which is supported by the support parts 34, but does not act upon the circumferential edge part of the substrate P, which is supported by the circumferential wall part 33; however, the negative pressure suction force does act upon the surroundings of the rib shaped support parts 7, which extend from the circumferential wall part 33 to the support parts 34, and, consequently, warpage and waviness that arise in the substrate P in the vicinity of the circumferential wall part 33 can be suppressed. In addition, although the rib shaped support parts 7 linearly support the substrate P, they are rib shaped and thus the area of their surfaces that contacts the wafer does not greatly increase; therefore, the rib shaped support parts 7 are not affected by dust.

Accordingly, with the present embodiment, it is possible to support the substrate P with satisfactory flatness even in the vicinity of the circumferential wall part 33. In addition, in the present embodiment, because the substrate P also makes contact with and is supported by the circumferential wall part 33, it is not necessary to strictly control the size of the gap of the suction groove, as in the case wherein the Venturi effect is employed; in addition, it is possible to avoid the infiltration of liquid into the suction space 38 and to maintain stable vacuum chucking of the substrate P even when performing immersion exposure. Furthermore, in the present embodiment, the lengths of the rib shaped support parts 7 that extend toward the support parts 34 are varied, and therefore, even if the tip parts of the rib shaped support parts 7 are arrayed, for example, linearly or arcuately, it is possible to exclude the possibility that the plurality of rib shaped support parts 7 will function as a virtual circumferential wall part and unfortunately cause warpage of the substrate P, and it is therefore also possible to more reliably support the substrate P flatly. Namely, the positions (boundary positions) where the support of the substrate P switches between the rib shaped support parts 7 and the support parts 34 are not all the same, and therefore the flatness of the substrate P does not degrade at these boundary positions.

In addition, with the substrate holder PH of the present embodiment, the circumferential wall part 33, the support parts 34, and the rib shaped support parts 7 are integrally formed, and it is therefore possible to simplify the fabrication process as compared with the case wherein each of the support parts are separately formed; furthermore, forming the support parts integrally contributes to the improvement of production efficiency, and also makes it possible to easily form the support surfaces of the substrate P so that they are flush with one another and to support the substrate P with a more satisfactory flatness. In particular, in the substrate holder PH according to the present embodiment, the rib shaped support parts 7 are provided on both sides of the substrate holder PH in the X axial directions, and extend in the X axial directions; therefore, when performing a scanning exposure (discussed later), even if the longitudinal directions of an exposure slit ES (shown by the chain double-dashed line in FIG. 1) are set to the X axial directions and an exposure is performed at a position wherein one end part of the exposure slit ES in the X axial directions straddles the circumferential wall part 33, it is possible to suppress the occurrence of warpage and waviness in the substrate P within the exposure slit ES.

Figure 3:
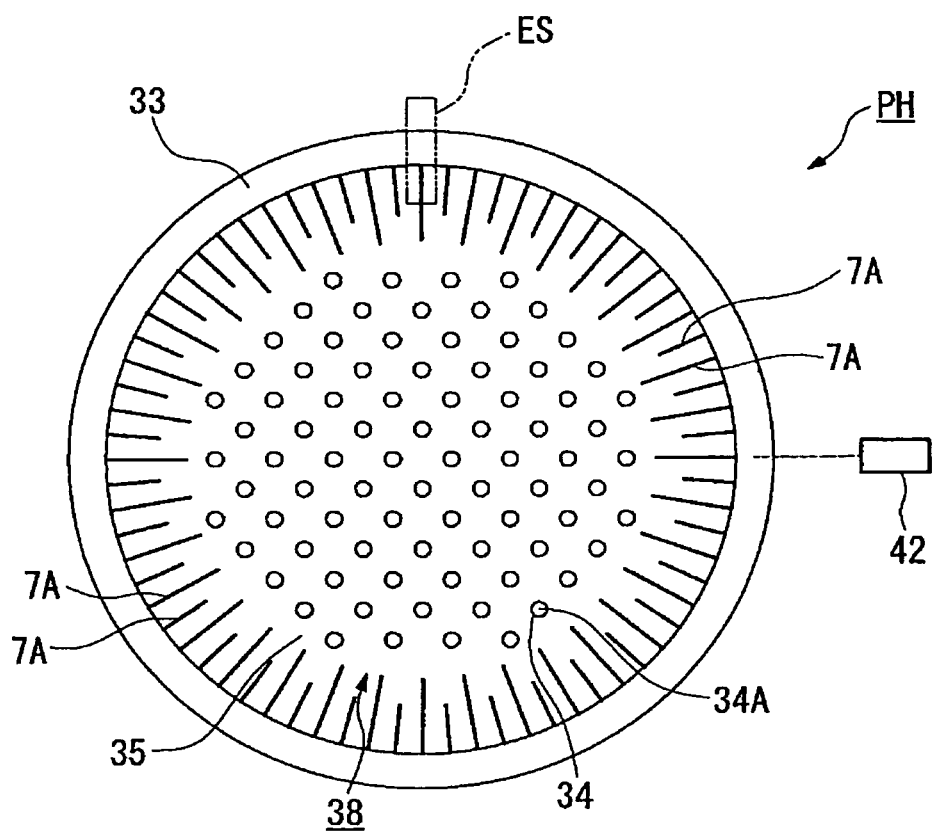
FIG. 3 is a plan view of the substrate holder according to the second embodiment of the present invention.

Continuing, the second embodiment of the substrate holder according to the present invention will now be explained, referencing FIG. 3.

Constituent elements in this figure that are the same as those in the first embodiment shown in FIG. 1 and FIG. 2 are assigned the same symbols.

In the substrate holder PH according to the second embodiment, rib shaped support parts 7A, which support the substrate P, are provided radially; furthermore, one end of each of the rib shaped support parts 7A is connected to the circumferential wall part 33, and the other end of each extends toward the support parts 34. The support surface area wherein these rib shaped support parts 7A support the substrate P is also set larger than the support surface area wherein the support parts 34 supports the substrate P. In addition, in the present embodiment as well, the lengths of at least adjacent rib shaped support parts 7A, which extend toward the support parts 34, vary. Other aspects of the constitution of the present embodiment are the same as the abovementioned first embodiment.

In addition to obtaining the same operation and effect of the first embodiment, the present embodiment makes it possible to support the substrate P with satisfactory flatness in any direction in the vicinity of the circumferential wall part 33. For example, as shown in FIG. 3, even if the longitudinal directions of the exposure slit ES is set to the Y axial directions, it is possible to suppress the occurrence of warpage and waviness in the substrate P within the exposure slit ES. Consequently, it is possible to relax the positioning accuracy of the substrate holder PH about the Z axis, and thereby to lessen the work needed for positioning.

Continuing, the stage apparatus, which comprises the above-mentioned substrate holder PH, and the exposure apparatus, which comprises the stage apparatus that serves as a substrate stage, will now be explained, referencing FIG. 4 through FIG. 7.

Figure 4:
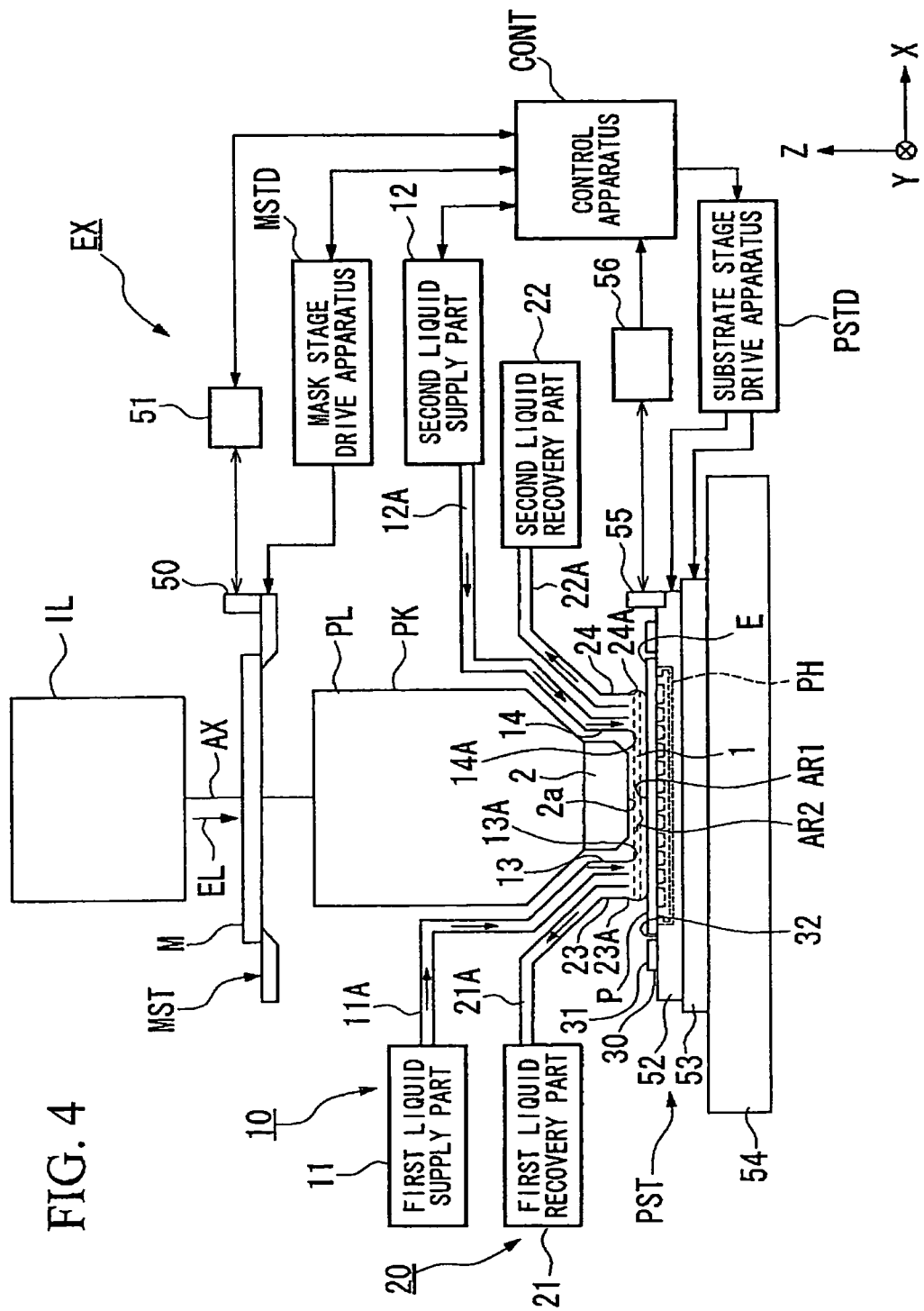
FIG. 4 is a schematic block diagram that shows one embodiment of an exposure apparatus of the present invention.

An exposure apparatus EX shown in FIG. 4 comprises: a mask stage MST that supports a mask M; a substrate stage PST that supports a substrate P via the abovementioned substrate holder PH; an illumination optical system IL that illuminates the mask M, which is supported by the mask stage MST, with exposure light EL of the exposure slit ES; a projection optical system PL that projects and exposes a pattern image of the mask M illuminated by the exposure light EL onto the substrate P that is supported by the substrate stage PST, which serves as the stage apparatus; and a control apparatus CONT that provides overall control of the operation of the entire exposure apparatus EX.

The exposure apparatus EX of the present embodiment is a liquid immersion type exposure apparatus that applies the liquid immersion method to substantially shorten the exposure wavelength, improve the resolution, as well as substantially increase the depth of focus, and comprises a liquid supply mechanism 10 that supplies a liquid 1 between the projection optical system PL and the substrate P, and a liquid recovery mechanism 20 that recovers the liquid 1 on the substrate P. In the present embodiment, pure water is used as the liquid 1. At least during the transfer of the pattern image of the mask M onto the substrate P, the exposure apparatus EX forms an immersion area AR2 with the liquid 1, which is supplied by the liquid supply mechanism 10, on at least one part of the substrate P that includes a projection area AR1 of the projection optical system PL.

Specifically, the exposure apparatus EX fills the space between an optical element 2 at the tip part of the projection optical system PL and the front surface (exposure surface) of the substrate P with the liquid 1, projects the pattern image of the mask M onto the substrate P through the projection optical system PL and through the liquid 1 between this projection optical system PL and the substrate P, and thereby exposes the substrate P.

Here, the present embodiment explains an example of a case of using a scanning type exposure apparatus (a so-called scanning stepper) as the exposure apparatus EX that exposes the substrate P with the pattern formed on the mask M, while synchronously moving the mask M and the substrate P in mutually different orientations (reverse directions) in the scanning direction. In the following explanation, the directions that coincide with an optical axis AX of the projection optical system PL are the Z axial directions, the directions in which the mask M and the substrate P synchronously move (in the scanning directions) within the plane perpendicular to the Z axial directions are the X axial directions, and the directions (non-scanning directions) perpendicular to the Z axial directions and the X axial directions are the Y axial directions. In addition, the directions about the X, Y and Z axes are the θX, θY and θZ directions, respectively. Furthermore, "substrate" herein includes a semiconductor wafer coated with a photoresist, which is a photosensitive material, and "mask" includes a reticle wherein a device pattern, which is reduction projected onto the substrate, is formed.

The illumination optical system IL illuminates the mask M, which is supported by the mask stage MST, with the exposure light EL, and comprises, for example: an exposure light source; an optical integrator that uniformizes the intensity of the luminous flux emitted from the exposure light source; a condenser lens that condenses the exposure light EL from the optical integrator; a relay lens system; and a variable field stop that sets an illumination region, which is on the mask M and is illuminated by the exposure light EL, to be slit shaped. The illumination optical system IL illuminates the prescribed illumination region on the mask M with the exposure light EL, which has a uniform luminous flux intensity distribution. Examples of light that can be used as the exposure light EL emitted from the illumination optical system IL include: deep ultraviolet light (DUV light), such as KrF excimer laser light (248 nm wavelength) and the bright lines (g, h, and i lines) in the ultraviolet region emitted from, for example, a mercury lamp; and vacuum ultraviolet light (VUV light), such as ArF excimer laser light (193 nm wavelength) and F2 laser light (157 nm wavelength). ArF excimer laser light is used in the present embodiment. As discussed above, the liquid 1 in the present embodiment is pure water, and the exposure light EL can transmit therethrough even if it is light from an ArF excimer laser. In addition, deep ultraviolet light (DUV light), such as KrF excimer laser light (248 nm wavelength) and the bright lines (g, h, and i lines) in the ultraviolet region, can also transmit through pure water.

The mask stage MST supports the mask M and is two dimensionally movable in the plane perpendicular to the optical axis AX of the projection optical system PL, i.e., in the XY plane, and is finely rotatable in the qZ directions. A mask stage drive apparatus MSTD, such as a linear motor, drives the mask stage MST. The control apparatus CONT controls the mask stage drive apparatus MSTD. Movable mirrors 50 are provided on the mask stage MST. In addition, a laser interferometer 51 is provided at a position opposing each movable mirror 50. The laser interferometers 51 measure in real time the position in the two dimensional directions and the rotational angles of the mask M on the mask stage MST, and outputs these measurement results to the control apparatus CONT. The control apparatus CONT drives the mask stage drive apparatus MSTD based on the measurement results of the laser interferometers 51, thereby positioning the mask M, which is supported by the mask stage MST.

The projection optical system PL projects and exposes the pattern of the mask M onto the substrate P with a prescribed projection magnification β, and comprises a plurality of optical elements, which includes the optical element 2 (lens) provided at the tip part of the projection optical system PL on the substrate P side, and this plurality of optical elements is supported by a lens barrel PK. In the present embodiment, the projection optical system PL is a reduction system that has a projection magnification β of, for example, ¼ or ⅕. Furthermore, the projection optical system PL may also be a unity magnification system or an enlargement system. In addition, the optical element 2 at the tip part of the projection optical system PL of the present embodiment is provided so that it is attachable and detachable (replaceable) to and from the lens barrel PK, and the liquid 1 of the immersion area AR2 contacts the optical element 2.

The optical element 2 is made of fluorite. Because fluorite has a strong affinity for water, the liquid 1 can adhere to substantially the entire surface of a liquid contact surface 2a of the optical element 2. Namely, because the liquid 1 (water) supplied in the present embodiment has a strong affinity for the liquid contact surface 2a of the optical element 2, the liquid contact surface 2a of the optical element 2 and the liquid 1 have strong adhesion characteristics, and therefore the optical path between the optical element 2 and the substrate P can be reliably filled with the liquid 1. Furthermore, the optical element 2 may be made of quartz, which also has a strong affinity for water. In addition, the liquid contact surface 2a of the optical element 2 may be given hydrophilic (lyophilic) treatment in order to further increase its affinity with the liquid 1. In addition, because the vicinity of the tip of the lens barrel PK contacts the liquid 1 (water), at least that vicinity is made of a metal, such as Ti (titanium), that is rust resistant.

The substrate stage PST supports the substrate P and comprises: a substrate table 52 that holds the substrate P via the substrate holder PH discussed above; an XY stage 53 that supports the substrate table 52; and a base 54 (base plate) that supports the XY stage 53. A substrate stage drive apparatus PSTD, such as a linear motor, drives the substrate stage PST. The control apparatus CONT controls the substrate stage drive apparatus PSTD. Driving the substrate table 52 controls the position of the substrate P, which is held on the substrate table 52, in the Z axial directions (the focus position) and in the qX and qY directions. In addition, driving the XY stage 53 controls the position of the substrate P in the X and Y directions (the position in the directions substantially parallel to the image plane of the projection optical system PL). In other words, the substrate table 52 functions as a Z stage that controls the focus position and the inclination angles of the substrate P via the substrate holder PH, and aligns the front surface of the substrate P with the image plane of the projection optical system PL by using an auto focus system and an auto leveling system; further, the XY stage 53 positions the substrate P in the X axial directions and the Y axial directions. Furthermore, the substrate table 52 and the XY stage 53 may of course be integrally provided.

Movable mirrors 55 are provided on the substrate stage PST (substrate table 52). In addition, a laser interferometer 56 is provided at a position opposing each movable mirror 55. The position in the two dimensional directions and the rotational angles of the substrate P on the substrate stage PST are measured in real time by the laser interferometers 56, and these measurement results are outputted to the control apparatus CONT. The control apparatus CONT drives the substrate stage drive apparatus PSTD based on the measurement results of the laser interferometers 56, and thereby positions the substrate P supported on the substrate stage PST.

Furthermore, each of the movable mirrors 55 may be formed by mirror polishing a side surface of the substrate stage PST (substrate table 52), and the height of each of the movable mirrors 55 may be at the same as the height of the substrate P (wafer).

In addition, a plate part 30, which surrounds the substrate P, is provided on the substrate stage PST (substrate table 52). The plate part 30 and the substrate table 52 are integrally provided, and a recessed part 32 is formed on the inner side of the plate part 30. Furthermore, the plate part 30 and the substrate table 52 may be separately provided. The substrate holder PH, which holds the substrate P, is disposed in the recessed part 32 (refer to FIG. 7). The plate part 30 has a flat surface 31 (flat part) that is at a height that is substantially the same as a front surface PA of the substrate P, which is held by the substrate holder PH that is disposed in the recessed part 32.

The liquid supply mechanism 10 supplies the prescribed liquid 1 to the substrate P and comprises: a first liquid supply part 11 and a second liquid supply part 12 that are capable of supplying the liquid 1; a first supply member 13, which is connected to the first liquid supply part 11 via a supply pipe 11A that has a passageway, that comprises a supply port 13A that supplies the liquid 1 fed from this first liquid supply part 11 to the substrate P; and a second supply member 14, which is connected to the second liquid supply part 12 via a supply pipe 12A that has a passageway, that comprises a supply port 14A that supplies the liquid 1 fed from this second liquid supply part 12 to the substrate P. The first and second supply members 13, 14 are disposed proximate to the front surface PA of the substrate P, and are provided at positions that are mutually different in directions within the plane of the substrate P. Specifically, the first supply member 13 of the liquid supply mechanism 10 is provided in one of the scanning directions (−X direction) with respect to the projection area AR1, and the second supply member 14 is provided in the other direction (+X direction).

Each of the first and second liquid supply parts 11, 12 comprises, for example, a tank that stores the liquid 1 and a pressure pump, and supplies the liquid 1 to the substrate P through the supply pipes 11A, 12A and the supply members 13, 14. In addition, the liquid supply operation of the first and second liquid supply parts 11, 12 is controlled by the control apparatus CONT, which is capable of independently controlling the amount of liquid 1 supplied by the first and second liquid supply parts 11, 12 to the substrate P per unit of time. In addition, each of the first and second liquid supply parts 11, 12 comprises a liquid temperature adjusting mechanism and supplies the substrate P with the liquid 1, which has a temperature that is substantially the same as the temperature (e.g., 23° C.) inside the chamber that houses the apparatus.

The liquid recovery mechanism 20 recovers the liquid 1 on the substrate P and comprises: first and second recovery members 23, 24 that comprise recovery ports 23A, 24A, respectively, that are disposed proximate to the front surface PA of the substrate P; and first and second liquid recovery parts 21, 22, which are respectively connected to these first and second recovery members 23, 24 via recovery pipes 21A, 22A, which have passageways. Each of the first and second liquid recovery parts 21, 22 comprises, for example, a suction apparatus (e.g., a vacuum pump) and a tank that stores the recovered liquid 1; further, these first and second liquid recovery parts 21, 22 recover the liquid 1 on the substrate P via the first and second recovery members 23, 24 and the recovery pipes 21A, 22A. The liquid recovery operation of the first and second liquid recovery parts 21, 22 is controlled by the control apparatus CONT, which is capable of controlling the amount of liquid 1 recovered by the first and second liquid recovery parts 21, 22 per unit of time.

Figure 5:
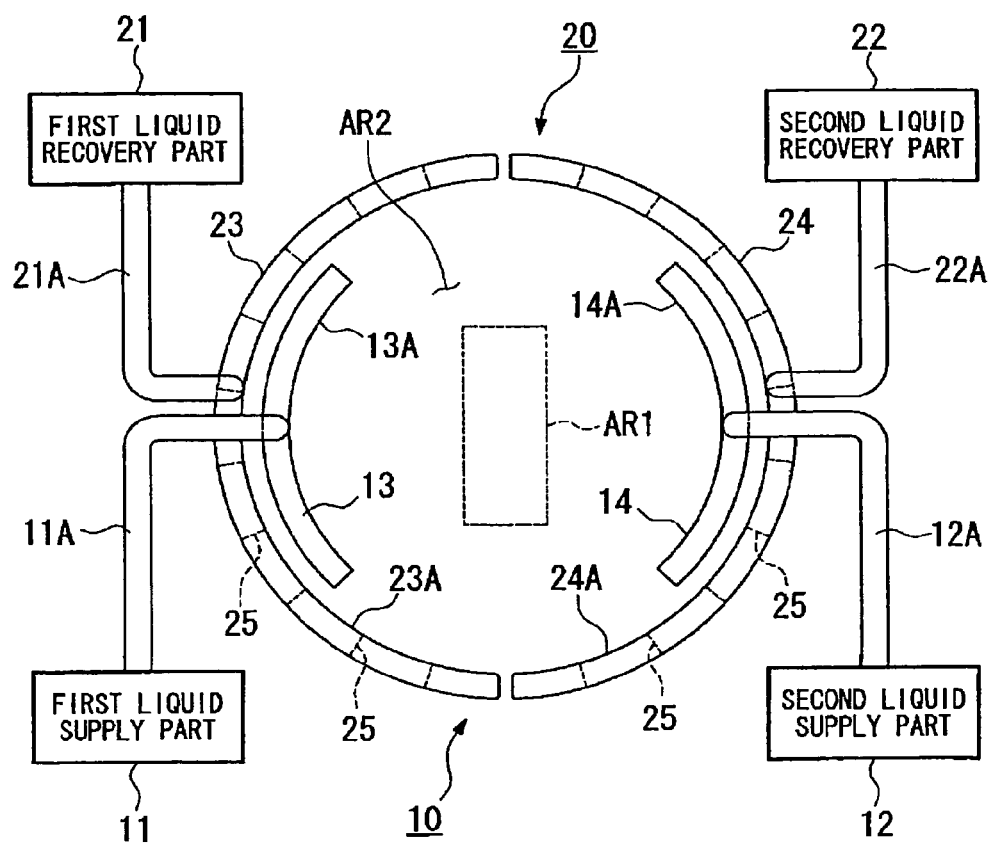
FIG. 5 is a schematic block diagram that shows a liquid supply mechanism and a liquid recovery mechanism.
Figure 5:
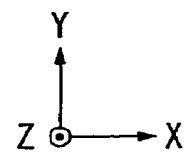

FIG. 5 is a plan view that schematically depicts the constitution of the liquid supply mechanism 10 and the liquid recovery mechanism 20. As depicted in FIG. 5, the projection area AR1 of the projection optical system PL is set to a slit shape (rectangular shape), wherein the longitudinal directions are in the Y axial directions (the non-scanning directions), and are formed on a part of the substrate P so that the immersion area AR2, which is filled with the liquid 1, includes the projection area AR1. Furthermore, the first supply member 13 of the liquid supply mechanism 10, which is for forming the immersion area AR2 of the projection area AR1, is provided in one of the scanning directions (−X direction) with respect to the projection area AR1, and the second supply member 14 is provided in the other direction (+X direction).

The first and second supply members 13, 14 are formed substantially arcuately in a plan view, and are set so that their supply ports 13A, 14A are at least as large in the Y axial directions as the projection area AR1 in the Y axial directions. Furthermore, the supply ports 13A, 14A, which are formed substantially arcuately in a plan view, are disposed so that the projection area AR1 is interposed therebetween in the scanning directions (the X axial directions). The liquid supply mechanism 10 supplies the liquid 1 to both sides of the projection area AR1 simultaneously via the supply ports 13A, 14A of the first and second supply members 13, 14.

The first and second recovery members 23, 24 of the liquid recovery mechanism 20 respectively comprise recovery ports 23A, 24A, which are accurately and continuously formed so that they face the front surface PA of the substrate P. Furthermore, the first and second recovery members 23, 24, which are disposed so that they face one another, form a substantially annular recovery port. The recovery ports 23A, 24A of the first and second recovery members 23, 24 are disposed so that they surround the first and second supply members 13, 14 of the liquid supply mechanism 10 as well as the projection area AR1. In addition, a plurality of partition members 25 are provided inside the recovery ports 23A, 24A, which are continuously formed so that they surrounds the projection area AR1.

The liquid 1 supplied to the substrate P from the supply ports 13A, 14A of the first and second supply members 13, 14 is supplied so that it spreads between the substrate P and the lower end surface at the tip part (optical element 2) of the projection optical system PL. In addition, the liquid 1 that flows to the outer side of the first and second supply members 13, 14 with respect to the projection area AR1 is recovered by the recovery ports 23A, 24A of the first and second recovery members 23, 24, which are disposed on the outer side of the first and second supply members 13, 14 with respect to the projection area AR1.

When performing a scanning exposure of the substrate P in the present embodiment, the amount of liquid 1 supplied per unit of time from the near side of the projection area AR1 in the scanning directions is set larger than that on the opposite side thereof. For example, if the exposure process is performed while moving the substrate P in the +X direction, the control apparatus CONT sets the amount of liquid 1 supplied from the −X side of the projection area AR1 (i.e., from the supply port 13A) greater than that from the +X side (i.e., from the supply port 14A); on the other hand, when performing the exposure process while moving the substrate P in the −X direction, the amount of liquid 1 supplied from the +X side of the projection area AR1 is set greater than that from the −X side. In addition, with respect to the scanning directions, the amount of liquid 1 recovered per unit of time on the near side of the projection area AR1 is set less than that on the opposite side. For example, when moving the substrate P in the +X direction, the amount of liquid 1 recovered from the +X side of the projection area AR1 (i.e., by the recovery port 24A) is greater than that from the −X side (i.e., by the recovery port 23A).

Figure 6:
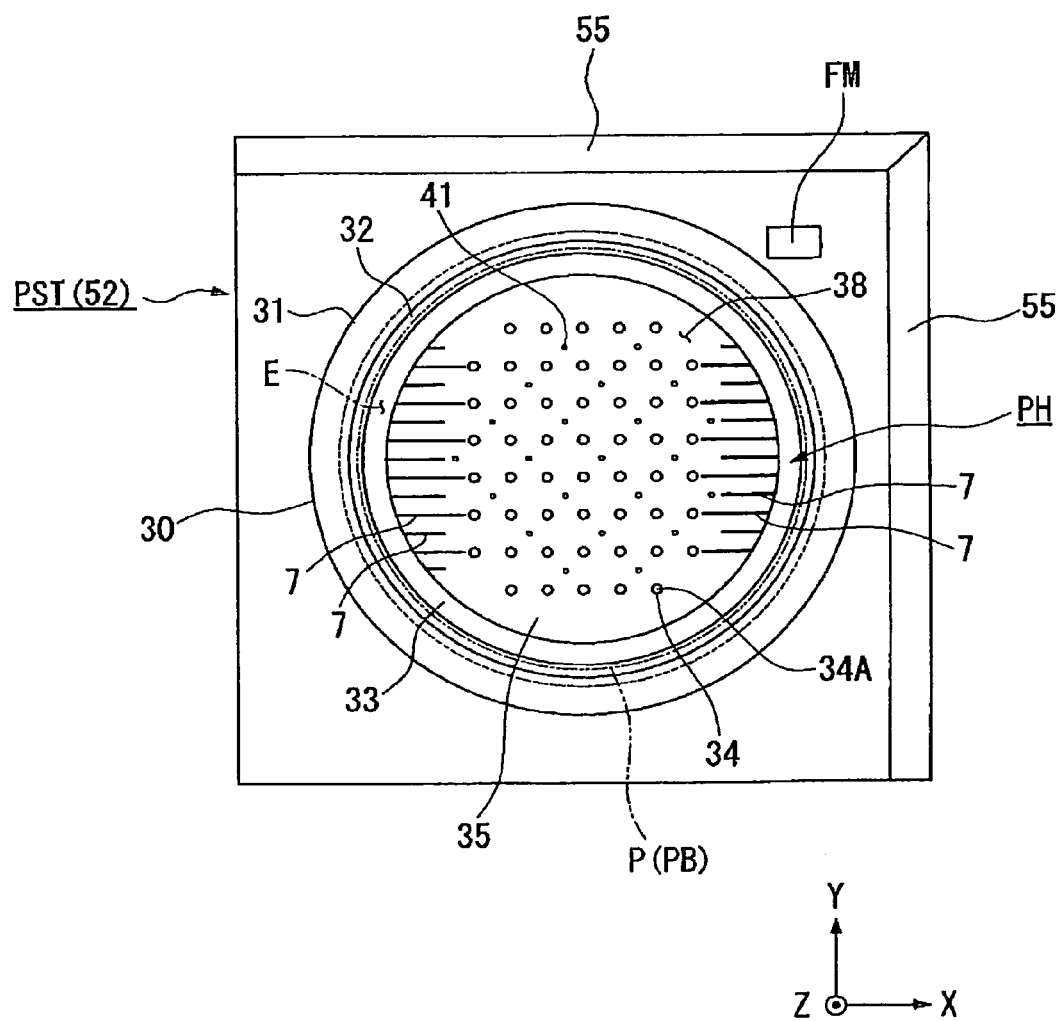
FIG. 6 is a plan view of a substrate stage.

FIG. 6 is a plan view of the substrate table 52 of the substrate stage PST, viewed from above. A movable mirror 55 is disposed at two mutually perpendicular edge parts of the substrate table 52, which is rectangularly shaped in a plan view. A fiducial mark FM, which is used when aligning the mask M and the substrate P with respect to a prescribed position, is provided in the vicinity of the part where the movable mirrors 55, 55 intersect. In addition, though they are not shown, various sensors, such as luminous flux intensity sensors, are provided around the substrate P on the substrate stage PST.

Figure 7:
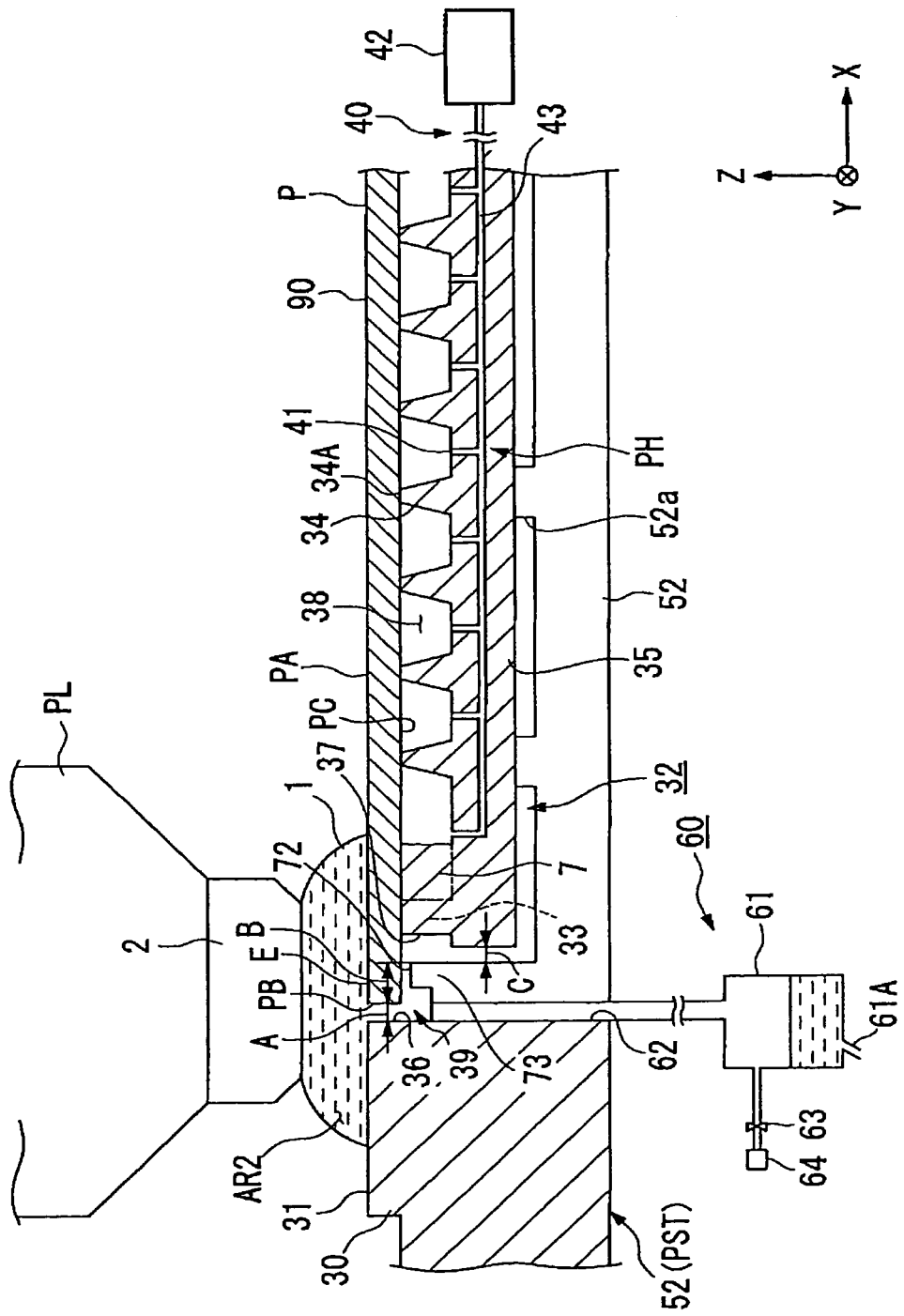
FIG. 7 is a cross sectional view of principal parts and shows one embodiment of the substrate stage according to the present invention.

In addition, the recessed part 32, which is circular in a plan view, if formed at the substantially center part of the substrate table 52, and a support part 52a is protrudingly provided to this recessed part 32 in order to support the substrate holder PH, as shown in FIG. 7. Furthermore, the substrate holder PH, which holds the substrate P, is disposed inside the recessed part 32 in a state wherein the substrate holder PH is supported by the support part 52a, and wherein there is a gap between the substrate holder PH and the substrate table 52. Furthermore, the pressure in the gap between the substrate table 52 and the substrate holder PH is set to atmospheric pressure (open). Furthermore, the plate part 30, which has the flat surface 31 (flat part) that is at a height substantially the same as the front surface PA of the substrate P, is provided integrally with the substrate table 52 around the substrate P.

In the present embodiment, among the surfaces of the substrate holder PH, the upper end surfaces of the circumferential wall part 33, the support parts 34 and the rib shaped support parts 7, as well as a side surface 37 are liquid repellent. Liquid repellency treatments (water repellency treatments) for the substrate holder PH include coating it with a fluororesin material or a liquid repellent material, such as acrylic resin material, or adhering a thin film consisting of the abovementioned liquid repellent material. Liquid repellent materials used to impart liquid repellency include materials that are insoluble in the liquid 1.

The substrate table 52 (plate part 30) comprises a side wall part 73 that forms the recessed part 32. The side wall part 73 is formed so that it is spaced apart from the substrate holder PH by a gap C, i.e., it has a shape that planarly overlaps (the outer circumference of) the substrate P, which is held by the flat surface 31, by a width B. The upper surface of the side wall part 73 is a circle of a size that, in a plan view, is spaced apart from the outer circumference (side surface PB) of the substrate P by a gap A (e.g., 0.3 to 0.5 mm), and comprises a liquid repellent surface 72 that, in a cross sectional view, opposes the outer circumferential part of the rear surface PC of the substrate P, which is held by the substrate holder PH. The liquid repellent surface 72 is formed at a position at which it does not contact the rear surface PC of the substrate P and is spaced apart therefrom by a gap of, for example, 0.2 mm (namely, at a depth of the thickness of the substrate P+0.2 mm from the flat surface 31).

The front surface PA, which is the exposure surface of the substrate P, is coated with a photoresist 90 (photosensitive material). In the present embodiment, the photosensitive material 90 is a photosensitive material (e.g., TARF-P6100 manufactured by Tokyo Ohka Kogyo Co., Ltd.) for ArF excimer laser light, is liquid repellent (water repellent), and has a contact angle of approximately 70 to 80°.

In addition, in the present embodiment, the side surface PB of the substrate P is given liquid repellency treatment (water repellency treatment). Specifically, the side surface PB of the substrate P is also coated with the abovementioned liquid repellent photosensitive material 90. Furthermore, the rear surface PC of the substrate P is also given liquid repellency treatment by coating it with the abovementioned photosensitive material 90.

Furthermore, part of the surface of the substrate table 52 (substrate stage PST) is given liquid repellency treatment and is therefore liquid repellent. In the present embodiment, the flat surface 31 of the substrate table 52 (plate part 30), the liquid repellent surface 72, and a step part 36 therebetween are all liquid repellent. The same treatment that is given to the substrate holder PH is also used for the liquid repellency treatment of the substrate table 52 (plate part 30). Furthermore, the substrate table 52 may be formed from a liquid repellent material (e.g., fluororesin).

In addition, the substrate stage PST comprises a recovery apparatus 60 that suctions and recovers the liquid 1 that flows into a second space 39 (which is formed by the step part 36, the side surface PB of the substrate P, and the liquid repellent surface 72) that communicates with the portion that opposes the rear surface PC of the substrate P. In the present embodiment, the suction apparatus 60 comprises: a tank 61 that is capable of storing the liquid 1; a passageway 62, which is provided inside the substrate table 52, that connects the space 39 and the tank 61; and a pump 64 that is connected to the tank 61 via a valve 63. Furthermore, liquid repellency treatment is also given to an inner wall surface of the passageway 62.

The following explains the method by which the exposure apparatus EX that has the constitution discussed above performs immersion exposure of an edge area E of the substrate P.

As shown in FIG. 7, when performing immersion exposure of the edge area E of the substrate P, the liquid 1 of the immersion area AR2 is disposed at part of the front surface PA of the substrate P and at part of the flat surface 31 of the plate part 30. At this time, the negative pressure suction force from the suction apparatus 40 does not act upon the substrate P at the circumferential wall part 33; however, the substrate P is linearly supported by the rib shaped support parts 7, which extend from the circumferential wall part 33 to the support parts 34 in the vicinity of the circumferential wall part 33, and the negative pressure suction force acts upon the surroundings of the support parts 7; consequently, the negative pressure suction force does not cause warpage and the like, and the substrate P can be supported with satisfactory flatness.

Consequently, it is possible to correct for waviness within the projection area AR1, which is set by the exposure slit ES discussed above, and to keep flatness in the projection area AR1 within a prescribed value by driving the substrate table 52 via the substrate stage drive apparatus PSTD to control the position of the substrate P in the Z axial directions as well the front surface position in the θX and θY directions. As a result, the pattern of the mask M can be projected onto a flat substrate P via the projection optical system PL and the liquid 1, and a high resolution pattern can thereby be formed on the substrate P.

Herein, because the side surface PB of the substrate P and the step part 36 that opposes such are given liquid repellency treatment and because the gap therebetween is not large, as shown in FIG. 7, it is difficult for the liquid 1 of the immersion area AR2 to infiltrate the gap A and virtually no liquid 1 flows therein as a result of the surface tension of the liquid 1. In addition, if the liquid 1 infiltrates the second space 39 from the gap A, both the rear surface PC of the substrate P and the liquid repellent surface 72 are liquid repellent and the gap between the rear surface PC and the liquid repellent surface 72 is minute; therefore, it is difficult for the liquid 1 that has infiltrated the second space 39 to infiltrate this gap and virtually none of the liquid 1 flows from that gap to the recessed part 32 as a result of the surface tension thereof. Furthermore, the liquid 1 that flows into the second space 39 is suctioned and recovered (refer to FIG. 4) by the recovery apparatus 60 into the tank 61 via the passageway 62 with a timing, such as when the substrate is replaced, that does not cause interference, even if vibrations attendant with suctioning are transmitted to the substrate P. The tank 61 is provided with a discharge passageway 61A, and the liquid 1 is discharged from the discharge passageway 61A if a prescribed amount has accumulated.

At this time, even if the liquid 1 reaches the substrate holder PH by way of, for example, the rear surface PC of the substrate P, warpage of the substrate P is suppressed, it is possible to reliably prevent the infiltration of the liquid 1 into the suction space 38 via the circumferential wall part 33 and the rib shaped support parts 7 because the upper end surfaces of the circumferential wall part 33 and the rib shaped support parts 7 are given liquid repellency treatment, and thus a stabler exposure process can be performed. In addition, because the upper end surfaces of the circumferential wall part 33, the rib shaped support parts 7, and the support parts 34 are given liquid repellency treatment, even if the liquid 1 scatters and adheres to these upper end surfaces during, for example, the replacement of the substrate P, it is possible to easily eliminate the liquid 1 on the upper end surfaces by measures such as blowing air, and thereby prevent such from adversely affecting the vacuum chucking of the substrate after that replacement.

Furthermore, the substrate holder PH of the abovementioned embodiment is constituted so that one end of each of the rib shaped support parts 7 is connected to the circumferential wall part 33, but the present invention is not limited thereto, and the rib shaped support parts 7 may be disposed so that they are spaced apart from the circumferential wall part 33 by a gap.

Figure 8:
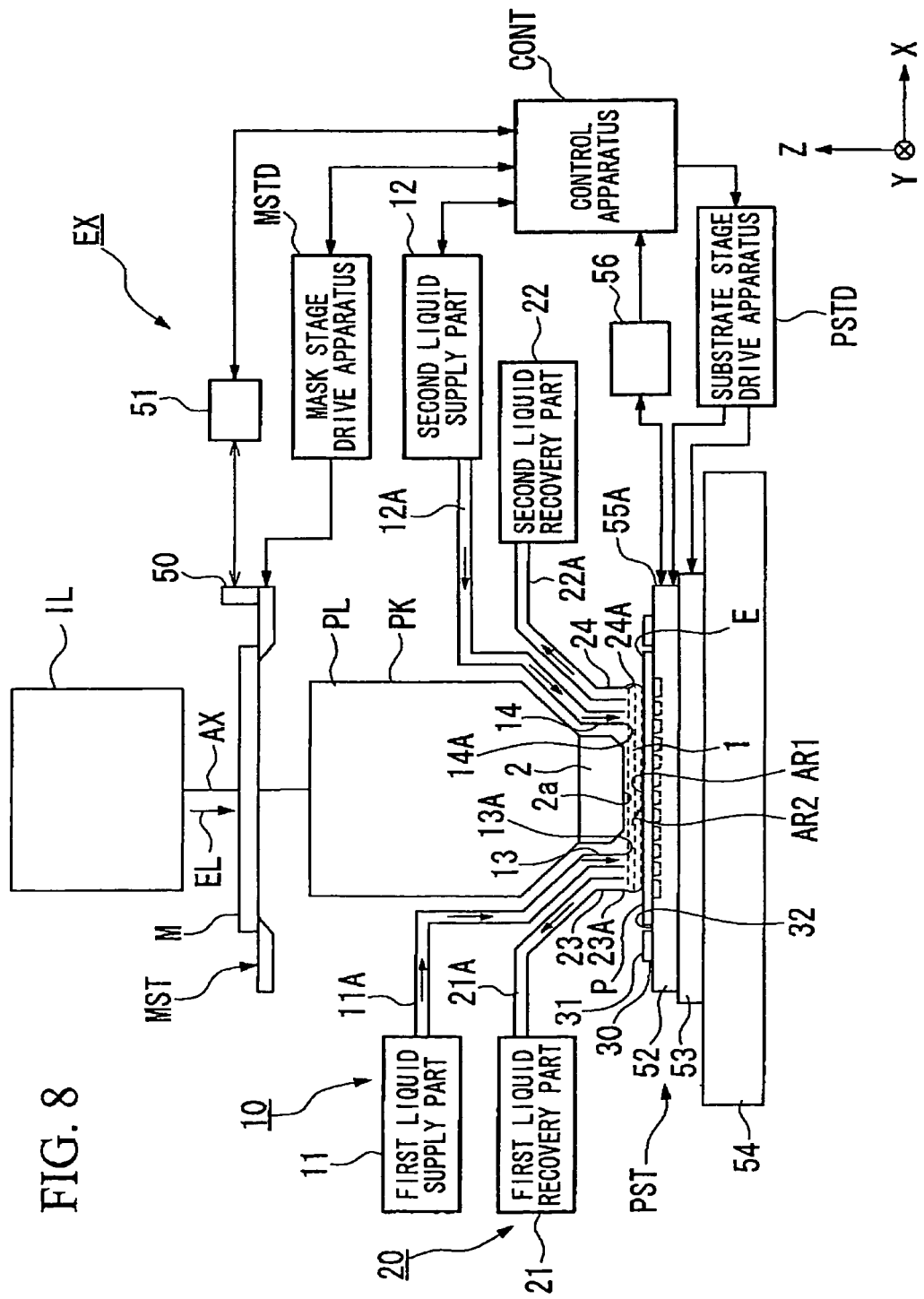
FIG. 8 is a schematic block diagram that shows another embodiment of the exposure apparatus.

In addition, the substrate stage PST of the abovementioned embodiment is constituted so that the substrate holder PH and the substrate table 52 are separately provided, but the present invention is not limited thereto, and they can also be formed integrally. Namely, the substrate table 52 can also be constituted so that it is made to function as the substrate holder. In this case, movable mirrors are not provided on the substrate table 52, which is the substrate holder, and, as shown in FIG. 8, the end surfaces of the substrate table 52 that oppose the laser interferometers 56 can be made to be reflecting surfaces 55A (reflecting parts). This constitution can reduce the number of parts and costs, and can also eliminate errors in mounting the movable mirrors, which makes it possible to improve the measurement accuracy of the laser interferometers when they measure the substrate table 52 (i.e., the substrate P).

The liquid 1 in each of the abovementioned embodiments comprises pure water. Pure water is advantageous because it can be easily obtained in large quantities at, for example, a semiconductor fabrication plant, and does not adversely impact, for example, the optical element (lens) and the photoresist on the substrate P. In addition, because pure water has no adverse impact on the environment and has an extremely low impurity content, it can also be expected to have the effect of cleaning the front surface of the substrate P and the surface of the optical element provided to the tip surface of the projection optical system PL.

Furthermore, PFPE (perfluorinated polyether) may be used as the liquid 1.

Further, because the refractive index n of pure water (water) with respect to the exposure light EL that has a wavelength of approximately 193 nm is substantially 1.44, if an ArF excimer laser (193 nm wavelength) is used as the light source of the exposure light EL, then the wavelength of the light on the substrate P would shorten by a multiple of 1/n, i.e., to approximately 134 nm, thereby obtaining a high resolution. Furthermore, because the depth of focus will increase approximately n times, i.e., approximately 1.44 times, that of in air, the numerical aperture of the projection optical system PL can be further increased if it is preferable to ensure a depth of focus that is approximately the same as that when used in air, and the resolution is also improved from this standpoint.

Furthermore, the substrate P in each of the abovementioned embodiments is not limited to a semiconductor wafer for fabricating semiconductor devices, and is also applicable to, for example, a glass substrate for a display device, a ceramic wafer for a thin film magnetic head, and a mask or the original plate of a reticle (synthetic quartz, silicon wafer) used by an exposure apparatus.

The exposure apparatus EX can also be adapted to a step-and-scan type scanning exposure apparatus (scanning stepper) that scans and exposes the pattern of the mask M by synchronously moving the mask M and the substrate P, as well as to a step-and-repeat type projection exposure apparatus (stepper) that performs a full field exposure of the pattern of the mask M with the mask M and the substrate P in a stationary state, and sequentially steps the substrate P. In addition, the present invention can also be adapted to a step-and-stitch type exposure apparatus that partially and superposingly transfers at least two patterns onto the substrate P. Furthermore, the present invention can also be adapted to an exposure apparatus, wherein a projection optical system PL projects a spot light to expose the substrate P with a pattern, without using the mask M.

In addition, the present invention can also be adapted to a twin stage type exposure apparatus as disclosed in, for example, Japanese Unexamined Patent Application, Publication No. H10-163099, Japanese Unexamined Patent Application, Publication No. H10-214783, and Published Japanese Translation No. 2000-505958 of the PCT International Publication.

The type of exposure apparatus EX is not limited to semiconductor device fabrication exposure apparatuses that expose the pattern of a semiconductor device on the substrate P, but can also be widely adapted to exposure apparatuses for fabricating liquid crystal devices or displays, and exposure apparatuses for fabricating, for example, thin film magnetic heads, imaging devices (CCDs), or reticles and masks.

If a linear motor is used in the substrate stage PST or the mask stage MST (refer to U.S. Pat. No. 5,623,853 and U.S. Pat. No. 5,528,118), then either an air levitation type that uses an air bearing, or a magnetic levitation type that uses Lorentz's force or reactance force may be used. In addition, each of the stages PST, MST may be a type that moves along a guide or may be a guideless type.

For the drive mechanism of each of the stages PST, MST, a planar motor may be used wherein a magnet unit, in which magnets are arranged two dimensionally, and an armature unit, in which coils are arranged two dimensionally, are opposed to one another, and each of the stages PST, MST are driven by electromagnetic force. In this case, any one of the magnet unit and the armature unit is connected to the stages PST, MST and the other one should be provided on the moving surface side of the stages PST, MST.

The reaction force generated by the movement of the substrate stage PST may be mechanically discharged to the floor (ground) by using a frame member so that it is not transmitted to the projection optical system PL, as recited in Japanese Unexamined Patent Application, Publication No. H08-166475 (U.S. Pat. No. 5,528,118).

The reaction force generated by the movement of the mask stage MST may be mechanically discharged to the floor (ground) by using a frame member so that it is not transmitted to the projection optical system PL, as recited in Japanese Unexamined Patent Application, Publication No. H08-330224 (U.S. Pat. No. 5,874,820). In addition, the reaction force may be counteracted by using the law of conservation of momentum, as recited in Japanese Unexamined Patent Application, Publication No. 8-63231 (U.S. Pat. No. 6,255, 796).

The exposure apparatus EX of the embodiments in the present application is manufactured by assembling various subsystems, including each constituent element recited in the claims of the present application, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes the mutual mechanical connection of the various subsystems, the wiring and connection of electrical circuits, the piping and connection of the atmospheric pressure circuit, and the like. Naturally, before the process of assembling the exposure apparatus from these various subsystems, there are also the processes of assembling each individual subsystem. When the process of assembling the exposure apparatus from the various subsystems is finished, a comprehensive adjustment is performed to ensure the various accuracies of the exposure apparatus as a whole. Furthermore, it is preferable to manufacture the exposure apparatus in a clean room wherein, for example, the temperature and the cleanliness level are controlled.

Figure 9:
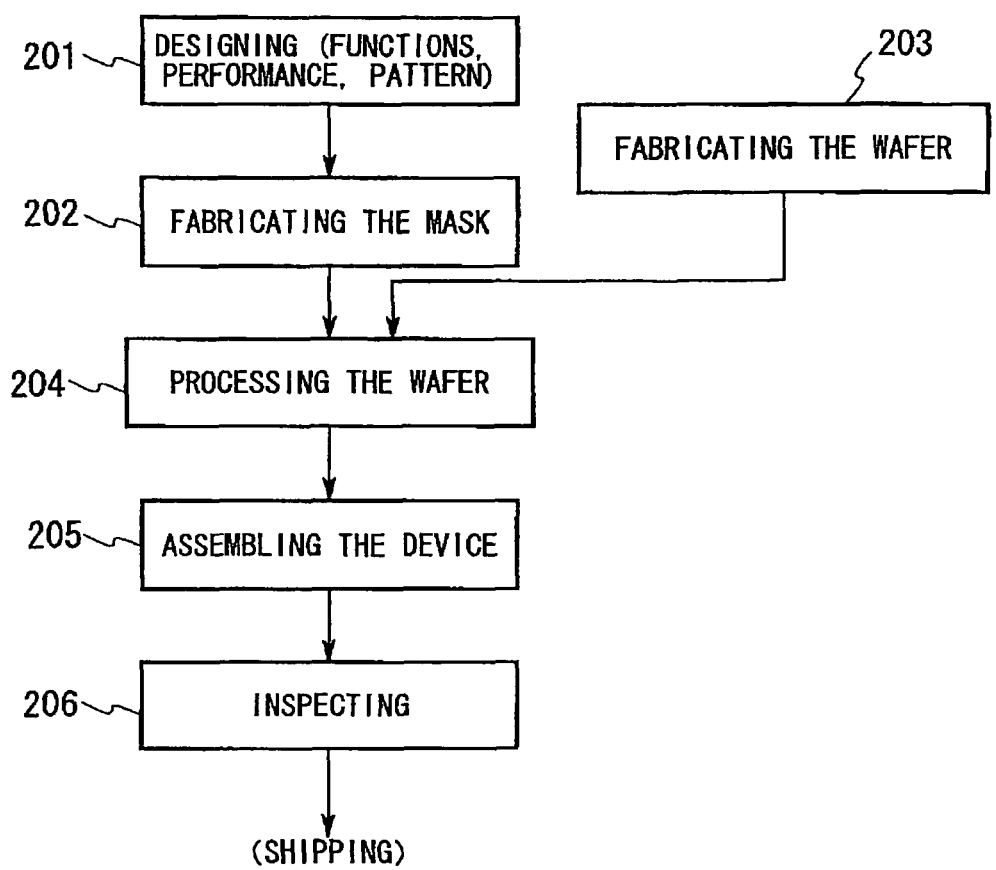
FIG. 9 is a flow chart diagram that shows one example of a semiconductor device fabrication process.

As shown in FIG. 9, a micro-device, such as a semiconductor device, is manufactured by: a step 201 that designs the functions and performance of the micro-device; a step 202 that fabricates a mask M (reticle) based on this design step; a step 203 that fabricates a substrate P (wafer), which is the base material of the device; a wafer processing step 204 wherein the exposure apparatus EX of the embodiments discussed above exposes a pattern of the mask M onto the substrate P (wafer); a device assembling step 205 (including a dicing process, a bonding process, and a packaging process); an inspecting step 206; and the like.

What is claimed is:

1. A substrate holder that constitutes a part of an exposure apparatus which exposes a pattern of a mask to a substrate while synchronously moving the mask and the substrate which is installed from external, the substrate holder comprising:
   a circumferential edge part that surrounds a suction space;
   first support parts that are provided at prescribed intervals in the suction space and that support the substrate; and
   second support parts that each extend from the circumferential edge part toward the first support parts and that support the substrate,
   wherein:
   each of the second support parts extends in a direction substantially parallel to a direction in which the mask and the substrate are synchronously moved, and extending lengths of the second support parts from the circumferential edge part toward the first support parts are made varied so that tip parts of the second support parts adjacent to the first support parts are non-linearly arranged and non-arcuately arranged, and
   a substrate contact area of each of the second support parts is greater than a substrate contact area of each of the first support parts.

2. The substrate holder according to claim 1, wherein a support surface area of the second support parts whereon the substrate is supported is larger than a support surface area of the first support parts whereon the substrate is supported.

3. The substrate holder according to claim 1, wherein each end part of the second support parts is integrally connected to the circumferential edge part.

4. The substrate holder according to claim 1, wherein the first support parts comprise a pin chuck.

5. The substrate holder according to claim 1, wherein at least one of the first support parts and the second support parts are made liquid-repellent.

6. The substrate holder according to claim 1, wherein the second support parts are made of a ceramic material.

7. The substrate holder according to claim 1, wherein the circumferential edge part and the second support parts are formed integrally.

8. The substrate holder according to claim 1, wherein the first support parts have a same height as a height of the second support parts.

9. The substrate holder according to claim 8, wherein the first support parts and the second support parts have a same height as that of the circumferential edge part.

10. The substrate holder according to claim 1, further comprising:
    an end surface at which a reflecting part is provided.

11. A stage apparatus that constitutes a part of an exposure apparatus and that holds and moves a substrate, the stage apparatus comprising:
    the substrate holder, which serves as a substrate holder that holds the substrate, according to claim 1.

12. The stage apparatus according to claim 11, further comprising:
    a flat surface disposed outside of the circumferential edge part of the substrate holder,
    wherein the substrate is supported by the substrate holder such that a gap is provided between the flat surface and a surface of the substrate held by the substrate holder.

13. The stage apparatus according to claim 12,
    wherein the surface of the substrate held by the substrate holder and the flat surface are substantially a same height.

14. The substrate holder according to claim 1, wherein none of the second support parts are positioned in a region of the suction space that is between the first support parts.

15. The substrate holder according to claim 1, wherein the first support parts are directly exposed to a vacuum in the suction space.

16. An exposure apparatus that comprises a stage apparatus which moves a substrate via a substrate holder supporting the substrate, and exposes a pattern of a mask to the substrate while synchronously moving the mask and the substrate,
    wherein:
    the substrate holder comprises, a circumferential edge part that surrounds a suction space, first support parts that are provided at prescribed intervals in the suction space and that support the substrate, and second support parts that each extend from the circumferential edge part toward the first support parts and that support the substrate,
    each of the second support parts extends in a direction substantially parallel to a direction in which the mask and the substrate are synchronously moved, and extending lengths of the second support parts from the circumferential edge part toward the first support parts are made varied so that tip parts of the second support parts adjacent to the first support parts are non-linearly arranged and non-arcuately arranged, and
    a substrate contact area of each of the second support parts is greater than a substrate contact area of each of the first support parts.

17. The exposure apparatus according to claim 16, wherein exposure is performed in a state wherein a liquid is filled between the substrate and a projection optical system, which projects the pattern onto the substrate.

18. The exposure apparatus according to claim 16, wherein none of the second support parts are positioned in a region of the suction space that is between the first support parts.

19. The exposure apparatus according to claim 16, wherein the first support parts are directly exposed to a vacuum in the suction space.

20. The exposure apparatus according to claim 16,
wherein the stage apparatus includes a flat surface disposed outside of the circumferential edge part, and the substrate is supported by the substrate holder such that a gap is provided between the flat surface and a surface of the substrate held by the substrate holder.

21. The exposure apparatus according to claim 20,
wherein a surface of the substrate held by the substrate holder and the flat surface are substantially a same height.

* * * * *